United States Patent [19]
Nishigoori et al.

[11] Patent Number: 5,376,816
[45] Date of Patent: Dec. 27, 1994

[54] BI-CMOS INTEGRATED CIRCUIT DEVICE HAVING BURIED REGION USE IN COMMON FOR BIPOLAR AND MOS TRANSISTORS

[75] Inventors: Tadashi Nishigoori; Kiyotaka Imai, both of Tokyo, Japan

[73] Assignee: NEC Corporation, Japan

[21] Appl. No.: 81,799

[22] Filed: Jun. 23, 1993

[30] Foreign Application Priority Data

Jun. 24, 1992 [JP] Japan .................... 4-165175

[51] Int. Cl.[5] .................... H01L 27/02; H01L 27/04; H01L 27/12
[52] U.S. Cl. .................... 257/370; 257/371; 257/372; 257/373; 257/378; 257/552
[58] Field of Search ............. 257/369, 370, 371, 372, 257/373, 378, 552, 566

[56] References Cited

U.S. PATENT DOCUMENTS

| | | | |
|---|---|---|---|
| 4,975,764 | 12/1990 | Hsu ........................................ | 257/370 |
| 5,001,366 | 3/1991 | Masuda et al. ...................... | 257/370 |
| 5,015,594 | 5/1991 | Chu et al. ............................ | 257/370 |

*Primary Examiner*—Ngan V. Ngo
*Attorney, Agent, or Firm*—Laff, Whitesel, Conte & Saret

[57] ABSTRACT

Disclosed herein is a Bi-CMOS IC which includes a semiconductor substrate of one conductivity type, a semiconductor layer of an opposite conductivity type formed on the substrate, a buried region of the opposite conductivity type formed between a first part of the semiconductor layer and the substrate and elongated under a second part of the semiconductor layer to form an elongated buried portion, a bipolar transistor formed in the first part by using the first part as a collector region thereof, a semiconductor region of the one conductivity type formed in the second part in contact with the elongated buried portion separately from the substrate, and an insulated gate transistor formed in the semiconductor region.

3 Claims, 3 Drawing Sheets

BI-CMOS INTEGRATED CIRCUIT DEVICE HAVING BURIED REGION USE IN COMMON FOR BIPOLAR AND MOS TRANSISTORS

BACKGROUND OF THE INVENTION

1. Field of the Invention

This invention relates to an improvement in a semiconductor integrated circuit device including bipolar and CMOS transistors fabricated on a single semiconductor substrate. Such a device is called a Bi-CMOS IC in general.

2. Description of the Prior Art

A Bi-CMOS IC has been widely used recently because it performs logic operations at a high speed with low power consumption. The Bi-CMOS IC requires, however, an element isolation technique as is employed in a bipolar IC. That is, the bipolar and MOS transistors are formed in a semiconductor layer of one conductivity type (for example, an N-type) formed on a semiconductor substrate of the other conductivity type (i.e., a P-type). More specifically, the Bi-CMOS IC includes an N-type epitaxial layer formed on a P-type substrate. The epitaxial layer is divided into a plurality of island regions by a P-type isolation region, and the bipolar transistors, in particular NPN transistors, are formed respectively in the island regions by using each island region as each collector region. In addition to the island region, N-type well regions and P-type well regions are formed selectively in the epitaxial layer. N-channel transistors are formed in the P-well regions and the P-channel transistors are formed in the P-well regions, respectively.

Although no particular isolation region is required to isolate MOS transistors from one another, the P-well regions are formed generally in contact with the substrate. For this region, each P-well region (i.e., the so-called substrate region of each N-channel MOS transistor) is supplied with the same voltage as that supplied to the substrate.

On the other hand, with requirement for high integration and high speed, each MOS transistor is required to be scaled down. The withstand voltage of each MOS transistor is lowered accordingly. Accordingly, it is desired to form each P-well region isolately from the substrate.

For this purpose, it was announced in IEEE international Solid-State Circuits Conference, Digest of Technical Papers, pp. 52–53, 1991 that an N-type buried layer was inserted between the P-well region and the substrate to electrically isolate the P-well region from the substrate.

In such a Bi-CMOS IC, however, the P-well region is required to be formed perfectly within the buried region. An extra margin for alignment between the buired region and the P-well region is thus needed, to reduce the integration density of the Bi-CMOS IC.

BRIEF SUMMARY OF THE INVENTION

Object of the Invention

It is therefore a principal object to provide a Bi-CMOS IC having a suitable structure for increasing integration density.

Summary of the Invention

A Bi-CMOS IC according to the present invention comprises a semiconductor substrate of one conductivity type, a semiconductor layer of an opposite conductivity type formed on the semiconductor substrate, a bipolar transistor formed in a part of the semiconductor layer by utilizing this part as a collector region thereof, a buried region of the opposite conductivity type formed between the substrate and the part of the semiconductor layer, this buried region is elongated to form an elongated buried region, a well region of the one conductivity type selectively formed in the semiconductor layer in contact with the elongated buried region but separately from the substrate, and a MOS transistor formed in the well region.

Thus, the present invention is featured in that the buried layer is used in common to the bipolar and MOS transistors. Accordingly, an alignment margin is reduced to increase the integration density of the Bi-CMOS IC.

BRIEF DESCRIPTION OF THE DRAWINGS

The above-mentioned and other objects, features and advantages of this invention will become more apparent by reference to the following detailed description taken in conjunction with the accompanying drawings, wherein.

DETAILED DESCRIPTION OF THE PREFERRED EMBODIMENTS

Figure 1:
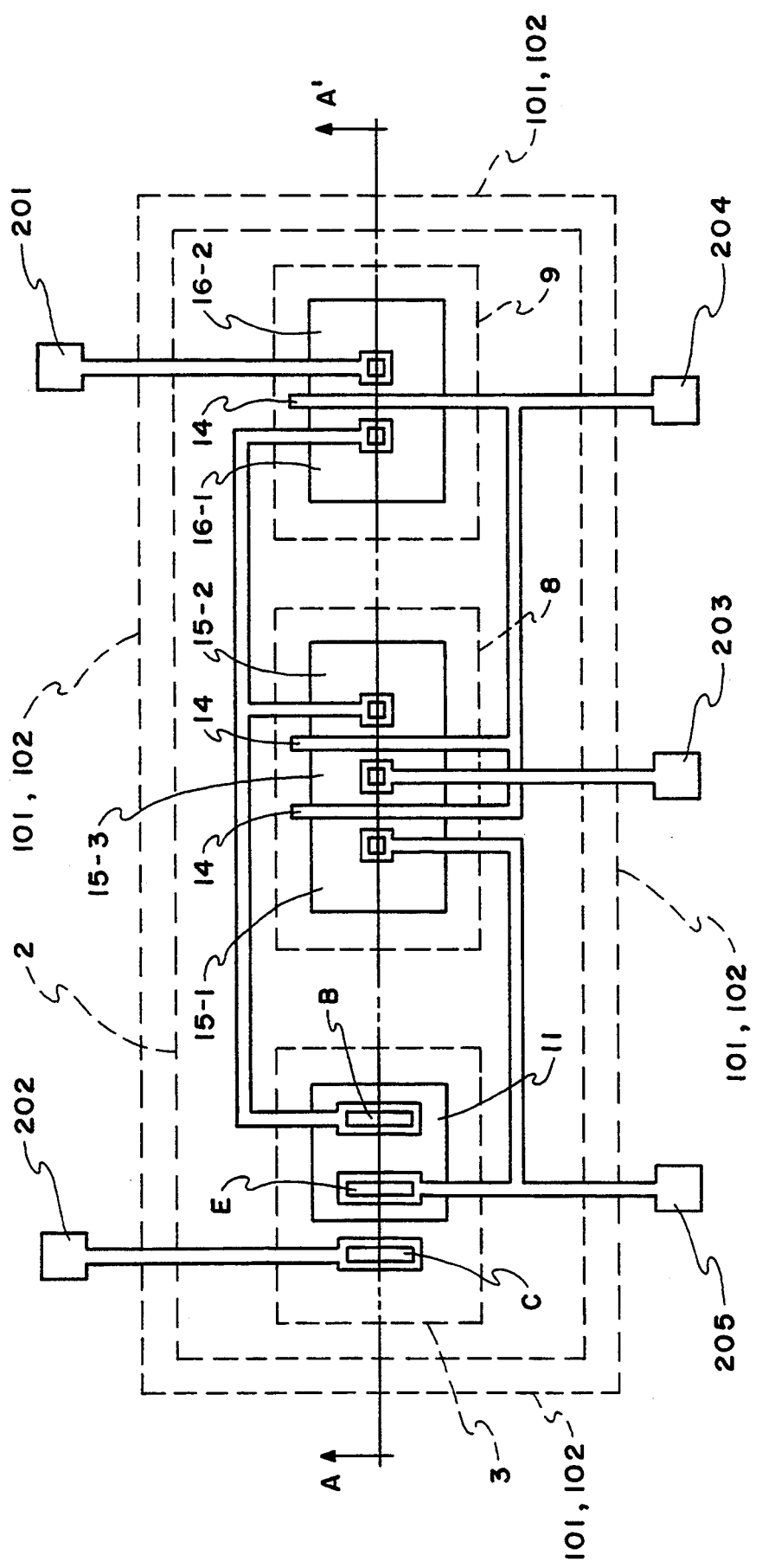
FIG. 1 is a plan view showing a plan view of a Bi-CMOS IC according to a first embodiment of the present invention.
Figure 2:
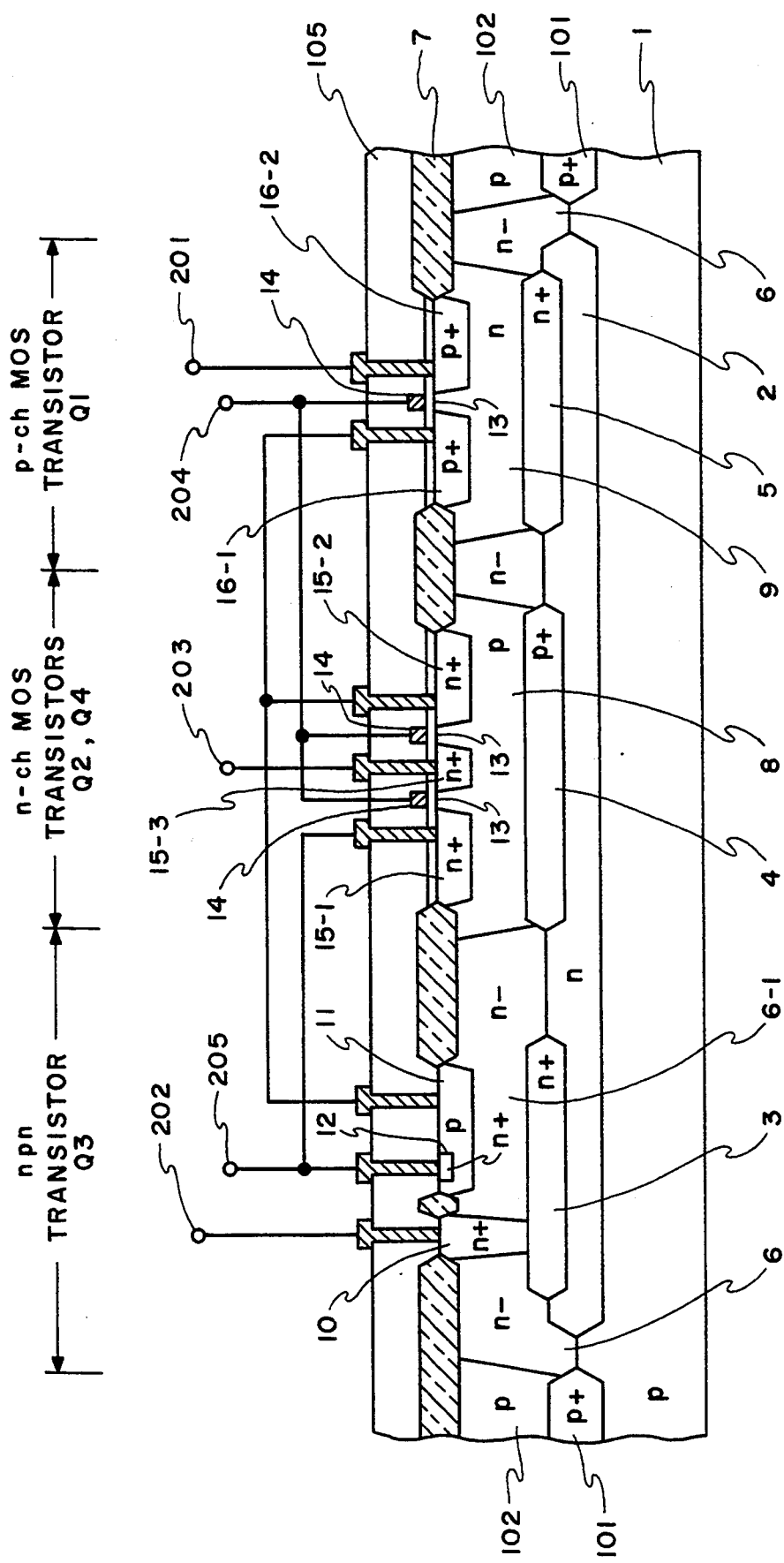
FIG. 2 is a cross-sectional view taken along line A–A' of FIG. 1.

Referring to FIGS. 1 and 2, a Bi-CMOS IC according to a first embodiment of the present invention includes a silicon substrate 1 of a P-type and a silicon epitaxial layer 6 of an N-type is formed on the substrate 1. An N-type buried region 2 is selectively formed between the substrate 1 and the layer 6. A P-type buired region 101 is further formed between the substrate 1 and the layer 6 to surround the buried region 2. A P-type isolation region 102 is selectively formed in the layer 6 in contact with the buried region 101 to form an island region made of a part of the layer 6, into which a bipolar transistor Q3, a P-channel MOS transistor Q1 and two N-channel MOS transistor Q2 and Q4 are formed.

The N-type buired region 3 is formed with a relatively large area in accordance with the present invention. That is, the buried region 3 is formed to have three portions on which an N-type buried region 3, a P-type buried region 4 and an N-type buired region 5 are respectively formed. The buried region 3 serves as the so-called collector buried region of the bipolar transistor Q3. Accordingly, a part 6-1 of the layer 6 operates as a collector region of the transistor Q3. A collector contact region 10 is formed in the collector region 6-1 to reach the buried region 3, and a P-type base region 11 is formed in the collector region 6-1. An N-type emitter region 12 is formed in the base region 11.

A P-type well region 8 is further formed in the layer 6 in contact with the buried region 4. This region 8 operates as a substrate region of the N-channel MOS transistors Q2 and Q4. Formed in the well region 8 are three N-type regions 15-1, 15-2 and 15-3. The regions 15-1 and 15-2 serve as drain regions of the transistors Q4 and Q2, respectively, and the region 15-3 serves as a common source region of the transistors Q2 AND Q4. Gate electrodes 14 of the transistors Q2 and Q4 are formed on gate insulating films 13 covering channel regions between the source and drain regions.

An N-type well region 9 is further formed in the layer 6 in contact with the buried region 5 to serve as a substrate region of the transistor Q1. A P-type drain region 16-1 and a P-type source region 16-2 of the transistor Q3 are formed in the well region 9, and a gate electrode 14 is formed on a gate insulating film.

Figure 3:
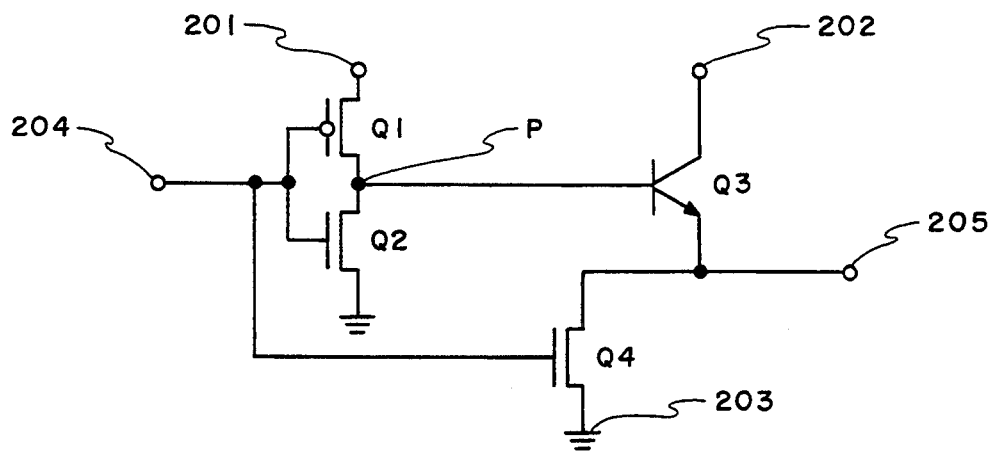
FIG. 3 is an equivalent circuit diagram indicative of the deviced illustrated in FIGS. 1 and 2.

Electrodes for the respective regions are provided through contact holes provided in an insulating layer 105 covering the entire surface of the respective regions and are connected as shown by interconnection wirings. Accordingly, this device is represented by an equivalent circuit shown in FIG. 3. As apparent from FIG. 3, this circuit constitutes an inverter. The MOS transistor Q1 and the MOS transistor Q2 are connected in series between a low-voltage (such as 3.3 V) supply terminal 201 and ground terminal 203, and their gates are connected in common to an input terminal 204. The base of the transistor Q3 is connected to the connection point P between transistors Q1 and Q2. The transistor Q3 is connected between a high-voltage (such as 5 V) supply terminal 202 and an output terminal 205. The transistor Q4 is connected between the output terminal 205 and the ground terminal 203. The gate of the transistor Q4 is connected to the input terminal 204.

When a signal at input 204 is the high level, the MOS transistor Q1 is turned off, whereas the transistor Q2 is turned on. Accordingly, the node p goes the low level to turn the transistor Q3 off. On the other hand, the transistor Q4 is turned on, thereby the low level being produced at the output terminal 205. When an input signal at the input terminal 204 is at the low level, on the other hand, the MOS transistor Q1 is turned on and the MOS transistor Q2 is turned off. The node p is thereby charged to the high level to turn the transistor Q3 on. The transistor Q4 is turned off. As a result, the high level signal is issued at the output terminal 205.

In this embodiment, the buried region 3 is used in common to the transistors Q1 to Q4 electrically separate them from the substrate 1. Accordingly, substantially no margin for alignment between the buried layer 4 and the well region 8 is needed. The distance between the transistor 102 and the transistor 101 or the MOS transistor 103 can be made small.

Figure 4:
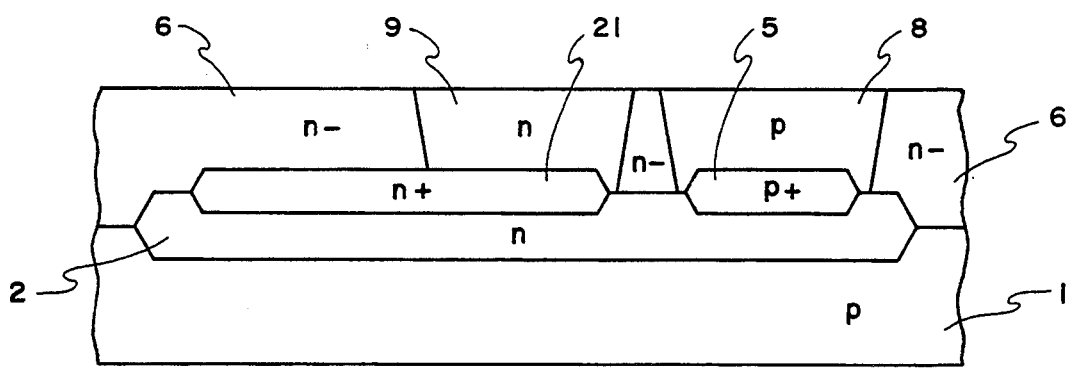
FIG. 4 is a cross-sectional illustrative of a second embodiment of the present invention.

Referring to FIG. 4 in which the same reference characters are used to designate the corresponding components to those in FIG. 2, in the second embodiment according to the present invention, an buried layer 21 is employed in common to the transistor Q3 and the p-channel MOS transistor Q1. Therefore higher integration density than the first embodiment can be attained.

Figure 5:
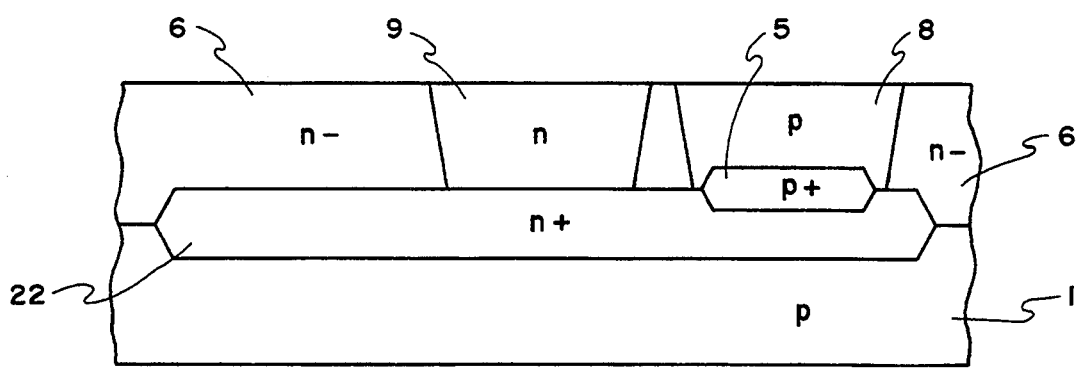
FIG. 5 is a cross-sectional illustrative of a third embodiment of the present invention.

Referring to FIG. 5, the third embodiment according to the present invention is so constructed that the impurity concentration of n-type buried layer 2 is increased such that the regions 3 and 5 (FIG. 2) and 21 (FIG. 21) can be omitted. This can lead to reduction in the number of fabrication steps.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention. For example, the conductivity types of the respective regions may be changed to the opposited type.

What is claimed is:

1. A semiconductor integrated circuit device comprising a semiconductor substrate of one conductivity type, a semiconductor layer of an opposite conductivity type formed on said semiconductor substrate and having first, second and third portions, a first buried region of said opposite conductivity type formed between said semiconductor substrate and said semiconductor layer and having fourth, fifth and sixth portions corresponding respectively to said first, second and third portions of said semiconductor layer, a bipolar transistor formed to have said first portion of said semiconductor layer as a collector region thereof, a first semiconductor region of said one conductivity type formed in said second portion of said semiconductor layer in contact with said fifth portion of said first buried region and in isolation from said semiconductor substrate by said fifth portion of said first buried region, a first insulated gate transistor formed in said first semiconductor region, a second semiconductor region of said opposite conductivity type formed in said third portion of said semiconductor layer in contact with said sixth portion of said first buried region, and a second insulated gate transistor of a second channel type formed in said second semiconductor region, said device further comprising a third insulated gate transistor of said first channel type formed in said first semiconductor region, said bipolar transistor and said first, second and third insulated gate transistors being interconnected to constitute an inverter circuit.

2. The device as claimed in claim 1, wherein said first semiconductor region comprises a first well region of said one conductivity type and a second buried region of said one conductivity type formed between said first well region and said fifth portion of said first buried region, said second semiconductor region comprising a second well region of said opposite conductivity type and a third buried region of said opposite conductivity type formed between said second well region and said sixth portion of said first buried region.

3. The device as claimed in claim 2, further comprising a fourth buried region of said one conductivity type formed between said semiconductor layer and said semiconductor substrate to surround said first buried region and an isolation region formed in said semiconductor layer in contact with said fourth buried region.

* * * * *